United States Patent
Zhou et al.

(10) Patent No.: US 11,164,930 B1
(45) Date of Patent: Nov. 2, 2021

(54) ORGANIC LIGHT EMITTING DIODE DISPLAY

(71) Applicant: WUHAN CHINA STAR OPTOELECTRONICS SEMICONDUCTOR DISPLAY TECHNOLOGY CO., LTD., Wuhan (CN)

(72) Inventors: Shang Zhou, Wuhan (CN); Shijuan Yi, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 477 days.

(21) Appl. No.: 16/336,650

(22) PCT Filed: Mar. 15, 2019

(86) PCT No.: PCT/CN2019/078307
§ 371 (c)(1),
(2) Date: Mar. 26, 2019

(87) PCT Pub. No.: WO2020/124819
PCT Pub. Date: Jun. 25, 2020

(30) Foreign Application Priority Data

Dec. 21, 2018 (CN) .......................... 201811575069.1

(51) Int. Cl.
*H01L 27/32* (2006.01)

(52) U.S. Cl.
CPC ........ *H01L 27/3276* (2013.01); *H01L 27/323* (2013.01)

(58) Field of Classification Search
CPC .......................... H01L 27/3276; H01L 27/323
See application file for complete search history.

(56) References Cited

U.S. PATENT DOCUMENTS

2014/0285734 A1* 9/2014 Lin ........................ G06F 1/1643
349/12

FOREIGN PATENT DOCUMENTS

| CN | 107331294 A | 11/2017 |
|---|---|---|
| CN | 107393422 A | 11/2017 |
| CN | 108693999 A | 10/2018 |
| CN | 108803164 A | 11/2018 |
| CN | 108831299 A | 11/2018 |
| CN | 108845445 A | 11/2018 |
| CN | 108986664 A | 12/2018 |
| CN | 109032417 A | 12/2018 |

* cited by examiner

*Primary Examiner* — Kyoung Lee
(74) *Attorney, Agent, or Firm* — Osha Bergman Watanabe & Burton LLP

(57) ABSTRACT

An organic light emitting diode (OLED) display including a display body and a chip encapsulation board is provided. The chip encapsulation board is electrically connected to the display body through a connecting component; wherein an edge of the display body is provided with a groove, and a connection of the connecting component and the display body is located at a sidewall of the display body defining of the groove.

18 Claims, 3 Drawing Sheets

ORGANIC LIGHT EMITTING DIODE DISPLAY

CROSS REFERENCE TO RELATED APPLICATION

This application claims the priority of International Application No. PCT/CN2019/078307, filed on 2019 Mar. 15, which claims priority to Chinese Application No. 201811575069.1, filed on 2018 Dec. 21. The entire disclosures of each of the above applications are incorporated herein by reference.

BACKGROUND OF INVENTION

Field of Invention

The present invention relates to the field of display technologies, and in particular, to an organic light emitting diode display.

Description of Prior Art

Organic light emitting diode (OLED) displays are regarded as next-generation displays because of their energy savings and portability. Compared with liquid crystal display technology, they have advantages of high contrast, high color gamut, large viewing angles and energy saving, and have broad application prospects in the mobile phone market. Comprehensive screen technology is a hotspot and a difficult point in the smart phone industry. Conventional chip encapsulation technologies in the comprehensive screen technology include chip on glass (COG), chip on film (COF), and chip on plastic (COP) technologies. COG technology integrates chips into glass backplanes; COF technology puts chips on glass backplanes on screen lines; COP technology is a unique encapsulating process for flexible OLEDs, because the backplane is not glass, but a flexible bendable material, the backplane is directly bent back on the basis of COG, and the breadth of the screen frame is further reduced.

However, no matter what kind of chip encapsulation technology is, the connection between a screen display region and a chip encapsulation board will increase the border width of the non-display region and reduce the screen-to-body ratio, thereby affecting the visual effect and experience.

Technical Problem

The connection between the screen display area and the chip encapsulation board will increase the border width of the non-display region and reduce the screen-to-body ratio.

SUMMARY OF INVENTION

An OLED display, wherein the OLED display includes a display body and a chip encapsulation board, the chip encapsulation board being electrically connected to the display body through a connecting component; wherein an edge of the display body is provided with a groove, and a connection of the connecting component and the display body is located at a sidewall of the display body defining the groove, the groove is located at a top or a bottom of the display body, and the chip encapsulation board is a chip on film (COF) board, a chip on glass (COG) board or a chip on plastic (COP) board.

Further, a first bending region is formed on the connecting component at a position near the connection of the connecting component and the display body, and the first bending region is located in the groove.

Further, the connecting component is bent toward a back face of the display body along the first bending region, the chip encapsulation board is located at the back face of the display body, a projection of the groove along a thickness direction of the display body encloses a projection of a bending apex of the connecting component along the thickness direction of the display body.

Further, the display body comprises a first backboard, a display panel disposed on a front face of the first backboard, and a touch layer disposed on the display panel, wherein the touch layer is an external touch layer.

Further, the display body is electrically connected to a first flexible circuit board which is used for driving a touch unit of the touch layer, and a connection of the first flexible circuit board and the display body is also located at the sidewall of the display body defining the groove.

Further, a second bending region is formed on the first flexible circuit board at a position near the connection of the first flexible circuit board and the display body, and the second bending region is located in the groove.

Further, the first flexible circuit board is bent toward a back face of the display body along the second bending region, the first flexible circuit board is located at a back face of the first backboard, a projection of the groove along a thickness direction of the display body encloses a projection of a bending apex of the first flexible circuit board along the thickness direction of the display body.

Further, the display body is mounted with a sensor located in the groove.

An OLED display, wherein the OLED display includes a display body and a chip encapsulation board, the chip encapsulation board being electrically connected to the display body through a connecting component; wherein an edge of the display body is provided with a groove, and a connection of the connecting component and the display body is located at a sidewall of the display body defining of the groove.

Further, a first bending region is formed on the connecting component at a position near the connection of the connecting component and the display body, and the first bending region is located in the groove.

Further, the connecting component is bent toward a back face of the display body along the first bending region, the chip encapsulation board is located at the back face of the display body, a projection of the groove along a thickness direction of the display body encloses a projection of a bending apex of the connecting component along the thickness direction of the display body.

Further, the display body comprises a first backboard, a display panel disposed on a front face of the first backboard, and a touch layer disposed on the display panel, wherein the touch layer is an external touch layer.

Further, the display body is electrically connected to a first flexible circuit board which is used for driving a touch unit of the touch layer, and a connection of the first flexible circuit board and the display body is also located at the sidewall of the display body defining the groove.

Further, wherein a second bending region is formed on the first flexible circuit board at a position near the connection of the first flexible circuit board and the display body, and the second bending region is located in the groove.

Further, the first flexible circuit board is bent toward a back face of the display body along the second bending region, the first flexible circuit board is located at a back face of the first backboard, a projection of the groove along a thickness direction of the display body encloses a projection of a bending apex of the first flexible circuit board along the thickness direction of the display body.

Further, the groove is located at a top or a bottom of the display body.

Further, the display body is mounted with a sensor located in the groove.

Further, the chip encapsulation board is a chip on film (COF) board, a chip on glass (COG) board or a chip on plastic (COP) board.

Advantageous Effect

When the chip encapsulation board and the first flexible circuit board are not bent, the bent regions of the chip encapsulation board and the first flexible circuit board are located in the groove, and the non-display region is fully utilized. After the chip encapsulation board and the first flexible circuit board are bent, the bent apex of the chip encapsulation board and the first flexible circuit board do not protrude from the edge of the display body, thereby preventing the width of the border of the non-display region from being increased, and enhancing the visual experience.

BRIEF DESCRIPTION OF DRAWINGS

In order to clearly describe the embodiments in the present invention or the prior art, the following instruction will introduce the drawings for the embodiments shortly. Obviously, the following description is only a few embodiments, for the common technical personnel in the field it is easy to acquire some other drawings without creative work.

Figure 2:
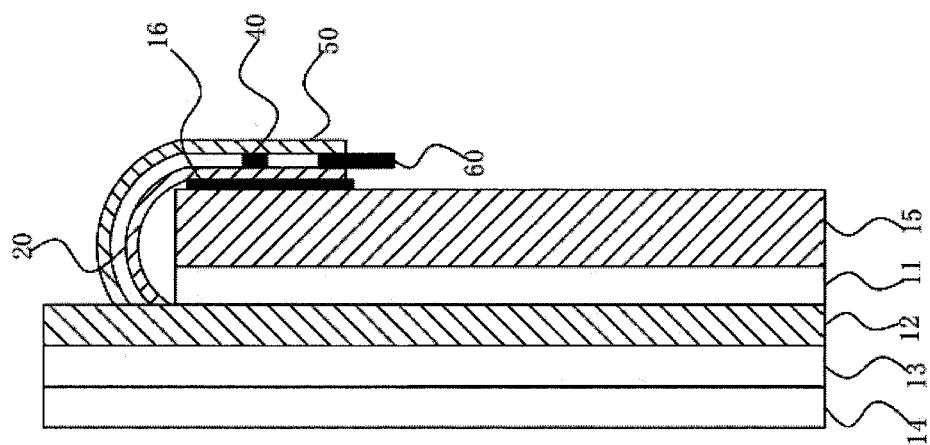
FIG. 2 is a schematic diagram of a second perspective of an OLED display according to embodiment 1 of the present invention.

REFERENCE MARKS 10, display body; 11, first backboard; 12, display panel; 13, touch layer; 14, polarizer; 15, protective layer; 16, second backboard; 17, groove; 20, chip encapsulation board; 30, connecting components; 31, first bending zone; 40, integrated circuit; 50, first flexible circuit board; 51, second bending region; 60, second flexible circuit board.

DETAILED DESCRIPTION OF PREFERRED EMBODIMENTS

Description of following embodiment, with reference to accompanying drawings, is used to exemplify specific embodiments which may be carried out in the present disclosure. Directional terms mentioned in the present disclosure, such as "top", "bottom", "front", "back", "left", "right", "inside", "outside", "side", etc., are only used with reference to orientation of the accompanying drawings. Therefore, the directional terms are intended to illustrate, but not to limit, the present disclosure. In the drawings, components having similar structures are denoted by same numerals.

The present invention is aimed to solve the technical problems of the OLED display of the prior art, in which the border width of the non-display region is increased due to the bent of the connection portion of the screen display region and the chip encapsulation board. The present invention can solve the above problems.

Embodiment 1

Figure 1:
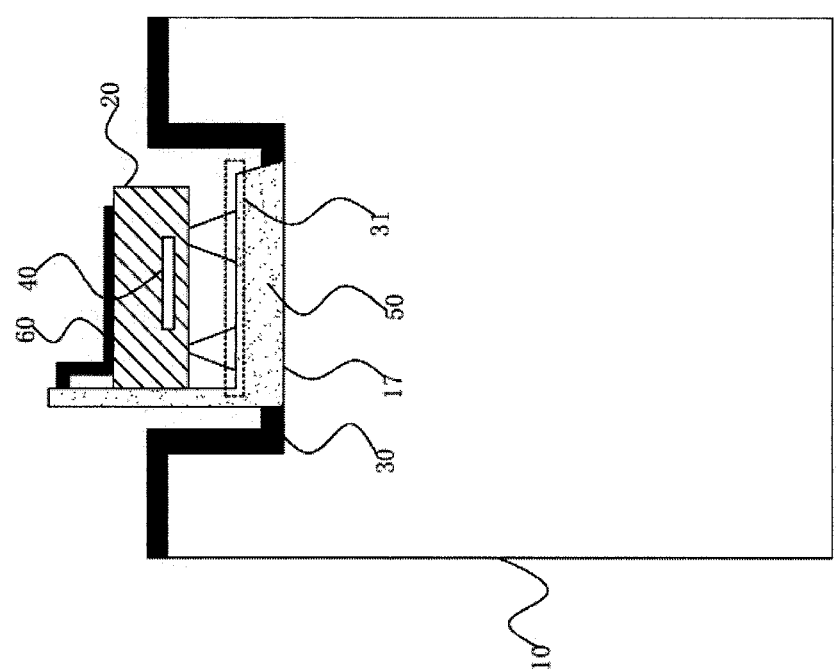
FIG. 1 is a schematic diagram of a first perspective view of an organic light emitting diode (OLED) display according to embodiment 1 of the present invention.

An organic light emitting diode (OLED) display, as shown in FIG. 1 and FIG. 2, the OLED display includes a display body 10 and a chip encapsulation board 20, the chip encapsulation board 20 is electrically connected to the display body 10 through a connecting component 30; wherein an edge of the display body 10 is provided with a groove 17, and a connection of the connecting component 30 and the display body 10 is located at a sidewall of the display body defining the groove 17.

When the chip encapsulation board 20 is not bent, the connecting component 30 is located in the groove 17, and the non-display region is fully utilized to prevent the connecting component 30 from being bent to increase the width of the border of the non-display region, and to prevent the chip encapsulation board 20 from being bent toward the back face of the display body 10, thereby preventing the connecting component 30 occupies part of the edge region of the display body 10, so that the effective display region of the display body 10 is increased to enhance the visual experience.

The connecting component 30 is a connection trace, and the chip encapsulation board 20 is a chip on film (COF) board.

Further, a first bending region 31 is formed on the connecting component 30 at a position near the connection of the connecting component 30 and the display body 10, and the first bending region 31 is located in the groove 17.

Further, the connecting component 30 is bent toward a back face of the display body 10 along the first bending region 31, the chip encapsulation board 20 is located at the back face of the display body 10, a projection of the groove 17 along a thickness direction of the display body 10 encloses a projection of a bending apex of the connecting component 30 along the thickness direction of the display body 10.

It can be understood that when the chip encapsulation board 20 is bent toward the back face of the display body 10 along the bending region, because the first bending region 31 is located in the groove 17, and the chip encapsulation board 20 is bent to the back face of the display body 10, a projection of the groove 17 along the thickness direction of the display body 10 encloses a projection of the bending apex of the connecting component 30 along the thickness direction of the display body 10. Thereby, the connecting component 30 and the connecting trace used for connecting the chip encapsulation board and the edge of the display body are bent to increase the width of the border of the non-display area.

Further, the display body 10 comprises a first backboard 11, a display panel 12 disposed on a front face of the first backboard 11, and a touch layer 13 disposed on the display panel 12, and a polarizer 14 is disposed on the touch layer 13; the display body 10 further includes a protective layer 15 disposed on the back face of the first backboard 11 and a second backboard 16 disposed on the protective layer 15.

Wherein, the chip encapsulation board 20 is provided with a second flexible circuit board 60 and an integrated circuit 40, after the chip encapsulation board 20 is bent to the back face of the display body 10, the chip encapsulation board 20 can be fixedly connected to the second backboard 16 by adhesive glue.

Figure 3:
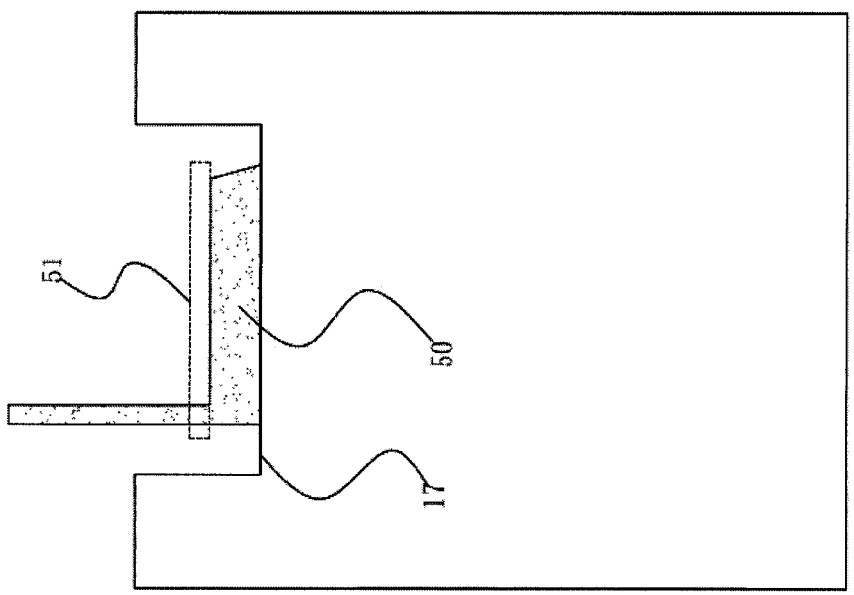
FIG. 3 is a schematic diagram showing a connection between a first flexible circuit board and a display screen body according to embodiment 1 of the present invention.

As shown in FIG. 2 and FIG. 3, the touch layer 13 is an external touch layer 13; the display body 10 is electrically connected to a first flexible circuit board 50 which is used for driving a touch unit of the touch layer 13, and a connection of the first flexible circuit board 50 and the display body 10 is also located at the sidewall of the display body defining the groove 17.

Further, a second bending region 51 is formed on the first flexible circuit board 50 at a position near the connection of the first flexible circuit board 50 and the display body 10, and the second bending region 51 is located in the groove 17.

Further, the first flexible circuit board 50 is bent toward the back face of the display body 10 along the second bending region 51, the first flexible circuit board 50 is located at the back face of the first backboard 11, a projection of the groove 17 along the thickness direction of the display body 10 encloses a projection of a bending apex of the first flexible circuit board 50 along the thickness direction of the display body 10.

The first flexible circuit board 50 drives the touch unit on the touch layer 13 to work normally, and the first flexible circuit board 50 is bent to the back face of the display body 10. Therefore, it is possible to prevent a bent portion of the first flexible circuit board 50 from increasing the width of the non-display region and making full use of the non-display region.

Specifically, the display body 10 is mounted with a sensor located in the groove 17 to fully utilize the non-display region; the sensor can be an earpiece or a camera, etc., which are not enumerated here.

Embodiment 2

Figure 4:
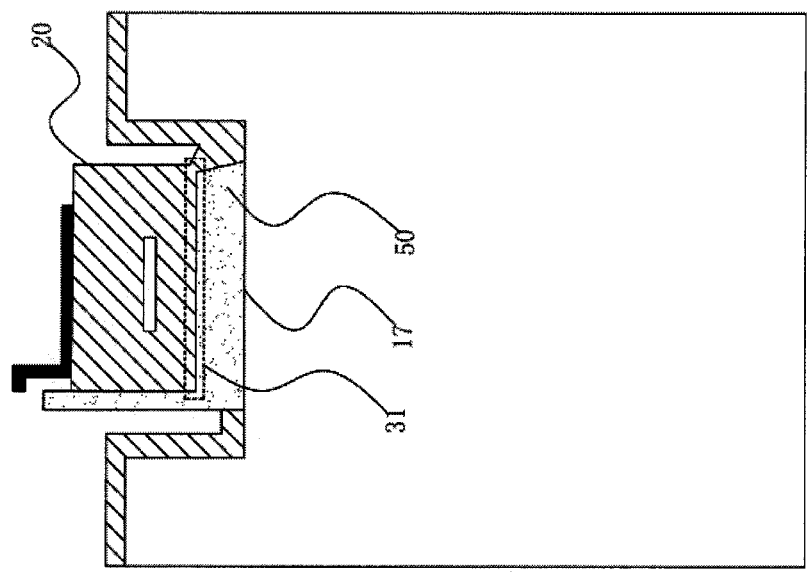
FIG. 4 is a schematic diagram of a first perspective of an OLED display according to embodiment 2 of the present invention.
Figure 5:
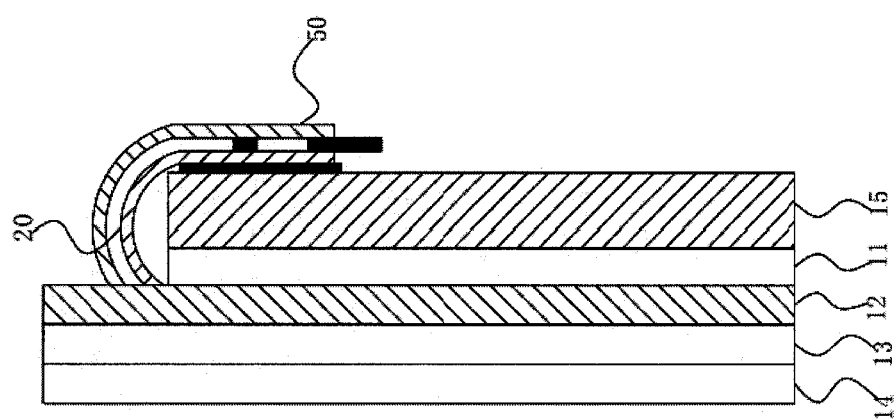
FIG. 5 is a schematic diagram of a second perspective of an OLED display according to embodiment 2 of the present invention.

An OLED display, as shown in FIG. 4 and FIG. 5, differs from embodiment 1 in the type of the chip encapsulation board 20.

Specifically, the chip encapsulation board 20 is a chip on plastic (COP) board or a chip on glass (COG) board.

The beneficial effects of the invention are: when the chip encapsulation board 20 and the first flexible circuit board 50 are not bent, bent regions of the chip encapsulation board 20 and the first flexible circuit board 50 are located in the groove 17, and the non-display region is fully utilized. After the chip encapsulation board 20 and the first flexible circuit board 50 are bent, the bent apex of the chip encapsulation board 20 and the first flexible circuit board 50 do not protrude from the edge of the display body 10, thereby preventing the width of the border of the non-display region from being increased, and enhancing the visual experience.

As is understood by persons skilled in the art, the foregoing preferred embodiments of the present disclosure are illustrative rather than limiting of the present disclosure. It is intended that they cover various modifications and that similar arrangements be included in the spirit and scope of the present disclosure, the scope of which should be accorded the broadest interpretation so as to encompass all such modifications and similar structures.

What is claimed is:

1. An organic light emitting diode (OLED) display, wherein the OLED display comprises:
    a display body; and
    a chip encapsulation board, the chip encapsulation board being electrically connected to the display body through a connecting component;
    wherein an edge of the display body is provided with a groove, and a connection of the connecting component and the display body is located at a sidewall of the display body defining the groove, the groove is located at a top or a bottom of the display body, and the chip encapsulation board is a chip on film (COF) board, a chip on glass (COG) board or a chip on plastic (COP) board.

2. The OLED display according to claim 1, wherein a first bending region is formed on the connecting component at a position near the connection of the connecting component and the display body, and the first bending region is located in the groove.

3. The OLED display according to claim 2, wherein the connecting component is bent toward a back face of the display body along the first bending region, the chip encapsulation board is located at the back face of the display body, a projection of the groove along a thickness direction of the display body encloses a projection of a bending apex of the connecting component along the thickness direction of the display body.

4. The OLED display according to claim 1, wherein the display body comprises a first backboard, a display panel disposed on a front face of the first backboard, and a touch layer disposed on the display panel, wherein the touch layer is an external touch layer.

5. The OLED display according to claim 4, wherein the display body is electrically connected to a first flexible circuit board which is used for driving a touch unit of the touch layer, and a connection of the first flexible circuit board and the display body is also located at the sidewall of the display body defining the groove.

6. The OLED display according to claim 5, wherein a second bending region is formed on the first flexible circuit board at a position near the connection of the first flexible circuit board and the display body, and the second bending region is located in the groove.

7. The OLED display according to claim 6, wherein the first flexible circuit board is bent toward a back face of the display body along the second bending region, the first flexible circuit board is located at a back face of the first backboard, a projection of the groove along a thickness direction of the display body encloses a projection of a bending apex of the first flexible circuit board along the thickness direction of the display body.

8. The OLED display according to claim 1, wherein the display body is mounted with a sensor located in the groove.

9. An organic light emitting diode (OLED) display, wherein the OLED display comprises:
    a display body; and
    a chip encapsulation board, the chip encapsulation board being electrically connected to the display body through a connecting component;
    wherein an edge of the display body is provided with a groove, and a connection of the connecting component and the display body is located at a sidewall of the display body defining of the groove.

10. The OLED display according to claim 9, wherein a first bending region is formed on the connecting component at a position near the connection of the connecting component and the display body, and the first bending region is located in the groove.

11. The OLED display according to claim 10, wherein the connecting component is bent toward a back face of the display body along the first bending region, the chip encapsulation board is located at the back face of the display body, a projection of the groove along a thickness direction of the display body encloses a projection of a bending apex of the connecting component along the thickness direction of the display body.

12. The OLED display according to claim 9, wherein the display body comprises a first backboard, a display panel disposed on a front face of the first backboard, and a touch layer disposed on the display panel, wherein the touch layer is an external touch layer.

13. The OLED display according to claim 12, wherein the display body is electrically connected to a first flexible circuit board which is used for driving a touch unit of the touch layer, and a connection of the first flexible circuit board and the display body is also located at the sidewall of the display body defining the groove.

14. The OLED display according to claim 13, wherein a second bending region is formed on the first flexible circuit board at a position near the connection of the first flexible circuit board and the display body, and the second bending region is located in the groove.

15. The OLED display according to claim 14, wherein the first flexible circuit board is bent toward a back face of the display body along the second bending region, the first flexible circuit board is located at a back face of the first backboard, a projection of the groove along a thickness direction of the display body encloses a projection of a bending apex of the first flexible circuit board along the thickness direction of the display body.

16. The OLED display according to claim 9, wherein the groove is located at a top or a bottom of the display body.

17. The OLED display according to claim 16, wherein the display body is mounted with a sensor located in the groove.

18. The OLED display according to claim 9, wherein the chip encapsulation board is a chip on film (COF) board, a chip on glass (COG) board or a chip on plastic (COP) board.

* * * * *